(12) United States Patent
Brewer et al.

(10) Patent No.: US 12,216,140 B2
(45) Date of Patent: Feb. 4, 2025

(54) TILT CALIBRATION FOR PROBE SYSTEMS

(71) Applicant: The Boeing Company, Chicago, IL (US)

(72) Inventors: Peter D. Brewer, Westlake Village, CA (US); Chia-Ming Chang, Agoura Hills, CA (US); Sevag Terterian, Lake Balboa, CA (US); Charbel Abijaoude, Newbury Park, CA (US); Diego Eduardo Carrasco, Los Angeles, CA (US)

(73) Assignee: The Boeing Company, Arlington, VA (US)

( * ) Notice: Subject to any disclaimer, the term of this patent is extended or adjusted under 35 U.S.C. 154(b) by 288 days.

(21) Appl. No.: 18/047,155

(22) Filed: Oct. 17, 2022

(65) Prior Publication Data

US 2024/0125817 A1    Apr. 18, 2024

(51) Int. Cl.
  *G01R 1/073*    (2006.01)
  *G01B 7/00*    (2006.01)
  *G01B 21/22*    (2006.01)

(52) U.S. Cl.
  CPC ........ *G01R 1/07307* (2013.01); *G01B 7/003* (2013.01); *G01B 21/22* (2013.01)

(58) Field of Classification Search
  CPC ............... G01R 1/073; G01R 1/07307; G01R 1/07378; G01R 1/07314; G01R 1/07328; G01R 31/2887; G01R 35/00; G01R 35/005; G01R 1/067; G01R 1/06794; G01R 31/28; G01R 31/2891; G01B 7/00; G01B 7/003; G01B 21/22; G01B 7/31
  See application file for complete search history.

(56) References Cited

U.S. PATENT DOCUMENTS

| 7,365,553 | B2 | 4/2008 | Garabedian et al. |
| 2017/0108534 | A1 | 4/2017 | Appinger et al. |
| 2017/0219626 | A1 * | 8/2017 | Gardell .............. G01R 1/07364 |
| 2020/0141976 | A1 | 5/2020 | Lim et al. |

FOREIGN PATENT DOCUMENTS

| JP | H05335385 A | 12/1993 |
| WO | WO-2007125756 A1 * | 11/2007 ........... B81C 99/005 |

* cited by examiner

*Primary Examiner* — Son T Le
(74) *Attorney, Agent, or Firm* — Alleman Hall & Tuttle LLP

(57) ABSTRACT

A probing system includes a device-under-test, a probe device, and a die bonder. The device-under-test includes test patterns. The probe device includes tilt angle sensors. The tilt angle sensors include spikes that protrude from the probe device. The die bonder is operational to mount the device-under-test, mount the probe device facing the device-under-test, compress the probe device and the device-under-test together to causes a subset of the spikes to contact the test patterns, measure a number of connections formed between the tilt angle sensors and the test patterns, determine a first offset angle and a second offset angle between the device-under-test and the probe device based on the number of connections, adjust the spherical positioner in one or more rotational axes in response to the first offset angle and the second offset angle to change a parallelism between the device-under-test and the probe device.

20 Claims, 10 Drawing Sheets

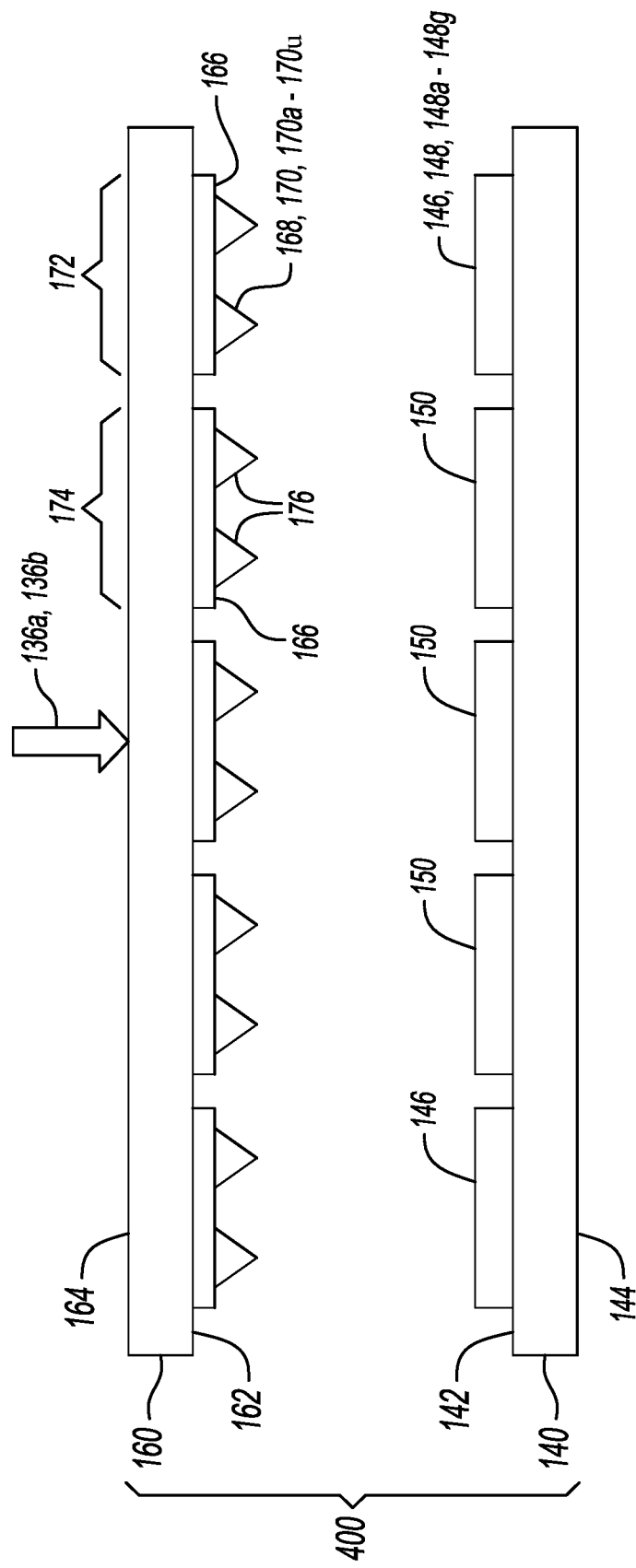

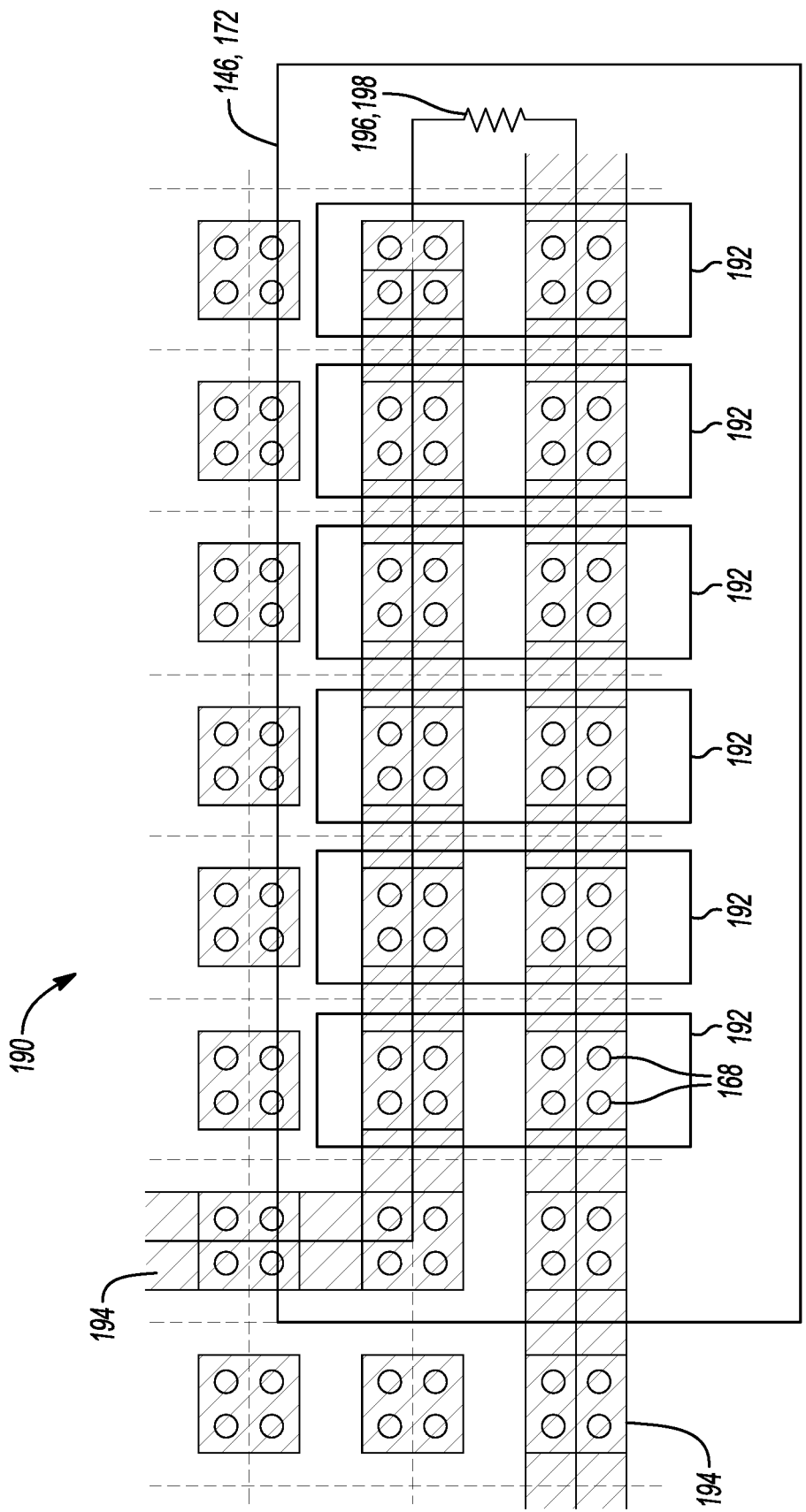

TILT CALIBRATION FOR PROBE SYSTEMS

TECHNICAL FIELD

The disclosure relates generally to area array probing, and in particular, to tilt calibration of probe systems.

BACKGROUND

Current computing systems involve dense integrations of a range of different elements, including processors, application specific integrated circuit accelerators, memory devices, high speed input/output devices, network processing devices, and power delivery/power management devices. Issues arise while probing individual devices to determine if the devices are working properly. If the probing system cannot accommodate tilt displacements, only part of the device will be contacted. Many factors that contribute to tilting angle errors are pressure dependent and may be transient under loads.

Accordingly, those skilled in the art continue with research and development efforts in the field of tilt calibration to provide uniform probing of devices-under-test.

SUMMARY

A probing system is provided herein. The probing system includes a device-under-test, a probe device, and a die bonder. The device-under-test includes a plurality of test patterns on a first surface. The probe device includes a plurality of tilt angle sensors. The plurality of tilt angle sensors include a plurality of spikes that protrude from a second surface of the probe device. The die bonder has a spherical positioner that is adjustable in a plurality of rotational axes. The die bonder is operational to mount the device-under-test with the first surface facing outward, mount the probe device with the second surface of the probe device facing the first surface of the device-under-test, compress the probe device and the device-under-test together with a first force that causes a subset of the plurality of spikes to contact the plurality of test patterns, measure a number of electrical connections formed between the plurality of tilt angle sensors and the plurality of test patterns, determine a first offset angle and a second offset angle between the first surface of the device-under-test and the second surface of the probe device based on the number of electrical connections, separate the probe device from the device-under-test, and adjust the spherical positioner in one or more of the plurality of rotational axes in response to the first offset angle and the second offset angle to change a parallelism between the first surface of the device-under-test and the second surface of the probe device.

In one or more embodiments of the probing system, the die bonder is further operational to compress the probe device and the device-under-test together with a second force after the spherical positioner is adjusted. The second force is greater than the first force.

In one or more embodiments, the probing system includes a meter operational to measure a plurality of total tilt conductances through the plurality of tilt angle sensors and the plurality of test patterns. Each of the plurality of tilt angle sensors includes two sets of the plurality of spikes. Each of the plurality of test patterns includes a plurality of pattern traces. Each of the plurality of pattern traces contributes a respective tilt conductance between the two sets while electrically connected to at least one spike of the plurality of spikes in each of the two sets.

In one or more embodiments of the probing system, the die bonder includes a processor operational to receive the plurality of total tilt conductances from the meter, calculate the first offset angle and the second offset angle based on the plurality of total tilt conductances, and control the adjustment of the spherical positioner in response to the first offset angle and the second offset angle.

In one or more embodiments of the probing system, the first offset angle is determined with a first group of the plurality of tilt angle sensors that are oriented in a first direction. The second offset angle is determined with a second group of the plurality of tilt angle sensors that are oriented in a second direction. The first direction is orthogonal to the second direction.

In one or more embodiments, the probing system includes a plurality of test pads disposed on the first surface of the device-under-test, and a plurality of probe tips that protrude from the second surface of the probe device. At least two probe tips of the plurality of probe tips contact each respective test pad of the plurality of test pads. The probing system further includes a meter operational to measure a touchdown conductance through each of the at least two probe tips and the respective test pad.

In one or more embodiments, the probing system includes a plurality of resilient pillars disposed between the plurality of spikes and the second surface of the probe device to account for height variations among the plurality of test patterns.

In one or more embodiments, the probing system includes a plurality of resistor networks disposed on the first surface of the device-under-test, a plurality of position sensors that protrude from the second surface of the probe device, and a meter operational to measure a plurality of position resistances through the plurality of position sensors and the plurality of resistor networks. The plurality of position resistances determines a first horizontal alignment and a second horizontal alignment between the device-under-test and the probe device. The first horizontal alignment and the second horizontal alignment are in orthogonal directions.

In one or more embodiments of the probing system, a first group of the plurality of test patterns are disposed around a periphery of the device-under-test. A second group of the plurality of test patterns are disposed in a central area of the device-under-test.

A method to aid in a tilt calibration for probing is provided herein. The method includes mounting a device-under-test in a die bonder with a first surface of the device-under-test facing outward. The device-under-test has a plurality of test patterns on the first surface. The die bonder has a spherical positioner that is adjustable in a plurality of rotational axes. The method further includes mounting a probe device in the die bonder with a second surface of the probe device facing the first surface of the device-under-test. The probe device has a plurality of tilt angle sensors. The plurality of tilt angle sensors have a plurality of spikes that protrude from the second surface. The method includes compressing the probe device and the device-under-test together with a first force that causes a subset of the plurality of spikes to contact the plurality of test patterns, measuring a number of electrical connections formed between the plurality of tilt angle sensors and the plurality of test patterns, determining a first offset angle and a second offset angle between the first surface of the device-under-test and the second surface of the probe device based on the number of electrical connections, separating the probe device from the device-under-test, and adjusting the spherical positioner in one or more of the plurality of rotational axes in response to the first offset angle and the second offset angle to change a parallelism between the first surface of the device-under-test and the second surface of the probe device.

In one or more embodiments, the method further includes compressing the probe device and the device-under-test together with a second force after the spherical positioner is adjusted, wherein the second force is greater than the first force.

In one or more embodiments of the method, the measuring of the number of electrical connections includes measuring a plurality of total tilt conductances through the plurality of tilt angle sensors and the plurality of test patterns. Each of the plurality of tilt angle sensors includes two sets of the plurality of spikes. Each of the plurality of test patterns includes a plurality of pattern traces. Each of the plurality of pattern traces contributes a respective tilt conductance between the two sets while electrically connected to at least one spike of the plurality of spikes in each of the two sets.

In one or more embodiments, the method further includes receiving at a processor the plurality of total tilt conductances, calculating the first offset angle and the second offset angle based on the plurality of total tilt conductances, and controlling the adjustment of the spherical positioner with the processor in response to the first offset angle and the second offset angle.

In one or more embodiments of the method, the determining of the first offset angle and the second offset angle includes determining the first offset angle with a first group of the plurality of tilt angle sensors that are oriented in a first direction, and determining the second offset angle with a second group of the plurality of tilt angle sensors that are oriented in a second direction. The first direction is orthogonal to the second direction.

In one or more embodiments, the method further includes measuring a touchdown conductance through each of at least two probe tips of a plurality of probe tips and a respective test pad of a plurality of test pads. The plurality of test pads are disposed on the first surface of the device-under-test. The plurality of probe tips extend from the second surface of the probe device. At least two probe tips of the plurality of probe tips contact each respective test pad of the plurality of test pads.

In one or more embodiments, the method further includes measuring a plurality of position resistances through a plurality of position sensors and a plurality of resistor networks, and determining a first horizontal alignment and a second horizontal alignment between the device-under-test and the probe device based on the plurality of position resistances. The plurality of resistor networks are disposed on the device-under-test. The plurality of position sensors are disposed on the probe device. The first horizontal alignment and the second horizontal alignment are in orthogonal directions.

A calibration kit is provided herein. The calibration kit includes a probe device, a device-under-test, a meter, and a processor. The probe device includes a plurality of tilt angle sensors. The plurality of tilt angle sensors have a plurality of spikes that protrude from a second surface of the probe device. Each of the plurality of tilt angle sensors includes two sets of the plurality of spikes. The device-under-test includes a plurality of test patterns disposable on a first surface. Each of the plurality of test patterns includes a plurality of pattern traces. Each of the plurality of pattern traces contributes a respective tilt conductance between the two sets while electrically connected to at least one spike of the plurality of spikes in each of the two sets. The meter is operational to measure a number of electrical connections formed between the plurality of tilt angle sensors and the plurality of test patterns while compressed together. The processor is operational to determine a first offset angle and a second offset angle between the first surface of the device-under-test and the second surface of the probe device based on the number of electrical connections.

In one or more embodiments of the calibration kit, the first offset angle and the second offset angle are correctable to less than 60 microradians.

In one or more embodiments of the calibration kit, a pitch of the plurality of spikes is less than 2 micrometers.

In one or more embodiments of the calibration kit, the plurality of pattern traces is formed from gold, aluminum, indium, copper, platinum, palladium, or an alloy thereof. The plurality of spikes is formed from one of (i) a single metal, (ii) an alloy and (iii) a layered combination selected from beryllium, gold, titanium, palladium, vanadium, copper, manganese, nickel, cobalt, iron, rhodium, chromium, molybdenum, ruthenium, platinum, tantalum, tungsten, rhenium, iridium, aluminum oxide, and silicon carbide.

The above features and advantages, and other features and advantages of the present disclosure are readily apparent from the following detailed description of the best modes for carrying out the disclosure when taken in connection with the accompanying drawings.

BRIEF DESCRIPTION OF THE DRAWINGS

FIG. 3 is a schematic diagram of a calibration kit in accordance with one or more exemplary embodiments.

FIG. 5 is a schematic plan diagram of an angle sensor layout in accordance with one or more exemplary embodiments.

DETAILED DESCRIPTION

Embodiments of the present disclosure generally include a system, method and/or kit that addresses tilt calibration of a probing device used in testing a device-under-test. The designs disclosed herein provide in-situ tilt angle sensors and control methods that provide local touchdown contact and global tilt angle measurements under load conditions to ensure high yield probing of fine-pitch area arrays. The tilt-angle sensors have a compact set of integrated sensors for fine-pitch area array probers that provides local contact sensing and global tilt angle measurements during low-force touchdowns, and feedback signals utilized by a prober platform (precision hardware) to correct non-parallel orientations. The tilt angle sensors are arranged as a set of distributed touchdown sensing units spread across the probe device, each with a set of redundant sensors (e.g., bridging contactor links with spikes on the probe device side that are short traces on the device-under-test). The tilt sensors may be positioned around a perimeter and in a central area of a probe device and the device-under-test. The arrangement and numbers of tilt angle sensors determines an accuracy of the tilt angle measurement. The tilt angle sensors provide information on a physical contact state of a particular location during touchdown of the probe device on the device-under-test. The information taken collectively, provides a measurement of the global tilt angle. The global tilt angles may be corrected by the prober platform using the information provided by the tilt angles sensors.

Figure 1:
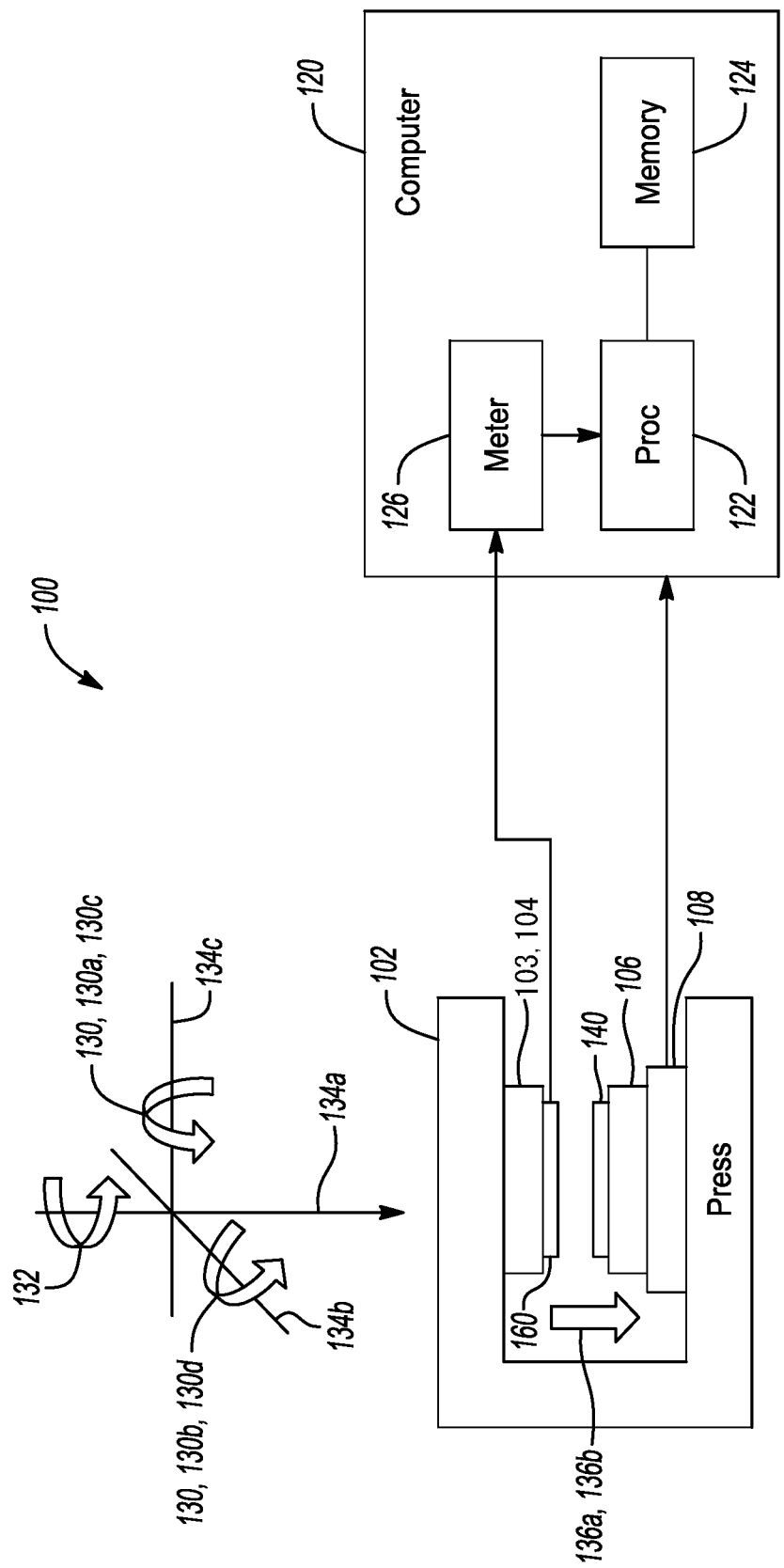
FIG. 1 is a schematic diagram of a probing system in accordance with one or more exemplary embodiments.

Referring to FIG. 1, a schematic diagram of an example implementation of a probing system 100 is shown in accordance with one or more exemplary embodiments. The probing system 100 generally includes a die bonder 102 and a computer 120. The die bonder 102 includes a spherical positioner 103, a top chuck 104, a bottom chuck 106, and a load cell 108. The computer 120 includes one or more processors 122 (one shown), one or more memory devices 124 (one shown), and one or more meters 126 (one shown).

The die bonder 102 implements a precision die bonder. In various embodiments, the die bonder 102 implements a substrate-to-substrate thermocompression press. For example, the die bonder 102 may be an FC300 precision die bonder available from Setna, LLC, Chester, New Hampshire. The die bonder 102 is operational to align and press the probe device 160 onto the device-under-test 140. The alignment may be provided by movement of the top chuck 104 relative to the bottom chuck 106 in multiple directions (e.g., a first direction 134c (e.g., X) and a second direction 134b (e.g., Y)). The multi-directional movement is provided, in part, by the spherical positioner 103. The top chuck 104 is moveable relative to the bottom chuck 106 in a vertical direction 134a (e.g., −Z).

Movement of the top chuck 104 downward along the vertical direction 134a presses a probe device 160 being held by the top chuck 104 with one of a first force 136a or a second force 136b against a device-under-test 140 being held by the bottom chuck 106. The first force 136a of the second force 136b compresses spikes formed on the probe device 160 into multiple test patterns on the device-under-test 140. In some embodiments, the device-under-test 140 may be held by the top chuck 104 and the probe device 160 may be held by the bottom chuck 106. The load cell 108 measures the first force 136a and the second force 136b being applied between the device-under-test 140 and the probe device 160.

The spherical positioner 103 implements a multi-dimensional joint. The spherical positioner 103 may tilt (or rotate) 130 the top chuck 104 relative to the bottom chuck 106. The tilt 130 may include movement in a pitch direction (or axis) 130a and a roll direction (or axis) 130b to align (e.g., make parallel) the facing surfaces of the probe device 160 and the device-under-test 140. The spherical positioner 103 also provides rotation of the top chuck 104 relative to the bottom chuck 106 in a yaw direction (or axis) 132. In some embodiments, the bottom chuck 106 may be rotatable relative to the top chuck 104 in the yaw direction 132.

The top chuck 104 and the bottom chuck 106 each implement a vacuum chuck. The top chuck 104 and the bottom chuck 106 are operational to hold the probe device 160 and the device-under-test 140 during the probing process.

The load cell 108 implements a pressure sensor. The load cell 108 is operational to detect the forces 136a-136b applied by the probe device 160 onto the device-under-test 140 during use of the die bonder 102.

The computer 120 is coupled to the probe device 160 and the load cell 108. The computer 120 implements one or more data processing computers. In embodiments with multiple computers 120, the individual computers 120 are coupled together to share data, memory space, and processing resources. The computer 120 may be operational to store the configuration data of the die bonder 102 and execute software used to analyze the information received from the probe device 160, the load cell 108, and the meter 126.

The processor 122 implements one or more processors within the computer 120. The processor 122 is in communication with the memory device 124 and the meter 126 to exchange commands and data. The processor 122 is operational to execute the software tools used to analyze the data generated by the probe device 160, the load cell 108, and the meter 126.

The memory device 124 implements one or more non-transitory computer readable storage devices (e.g., random access memory, read-only memory, magnetic hard drives, solid-state drives, etc.). The memory device 124 stores software programs (or tools) that are executed by the processor 122.

The meter 126 implements one or more conductance, resistance, voltage and/or current meters. The meter 126 is operational to detect and report changes in conductance/resistance in response to various spikes of the probe device 160 making electrical contact with the test patterns on the device-under-test 140. The meter 126 is also operational to measure voltages and/or currents at test pads on the device-under-test 140 during probing operations.

The probing system 100 implements a technique for measuring a multi-dimensional tilt between the device-under-test 140 and the probe device 160. Probing of fine-pitch area arrays (e.g., less than 2.5 micrometers (μm) pitch arrays) is sensitive to a degree of parallelism between the upward-facing first surface (or first side) of the device-under-test 140 is with the downward-facing second surface (or second side) of the probe device 160. The probing system 100 provides high-resolution tilt measurements (e.g., less than ±60 microradians) over large area substrates, including wafers, tiles, and/or die level substrates. Arrays of fine-pitch metal knife-edge-like structures (e.g., spikes) are arranged as multiple tilt angle sensors on the second surface of the probe device 160. Matching arrays conductive traces are arranged as multiple test patterns on the first surface of the device-under-test 140. The spikes of the tilt angle sensors are used to electrically contact the test patterns as the probe device 160 and the device-under-test 140 are brought together. The spikes may be fabricated as conically symmetric tips in a photolithographic process that enables spike arrays to be formed on silicon or other substrates over large areas with low variation in tip heights. The conductive traces may be fabricated as metal stipes. The test patterns and the tilt angle sensors are be positioned around a periphery of the probe device 160 and the device-under-test 140. Some of the test patterns and the tilt angle sensors may also be positioned within an interior region of the probe device 160 and the device-under-test 140. Knowledge of proper tilt alignment between the device-under-test 140 and the probe device 160 provides confidence while probing high density interfaces that are subsequently used to fabricate two-and-a-half dimensional and three-dimensional integrated microelectronic systems. Redistribution layers may route the individual array spike probes to an edge of the probe device 160 for subsequent readout to the computer 120.

Figure 2:
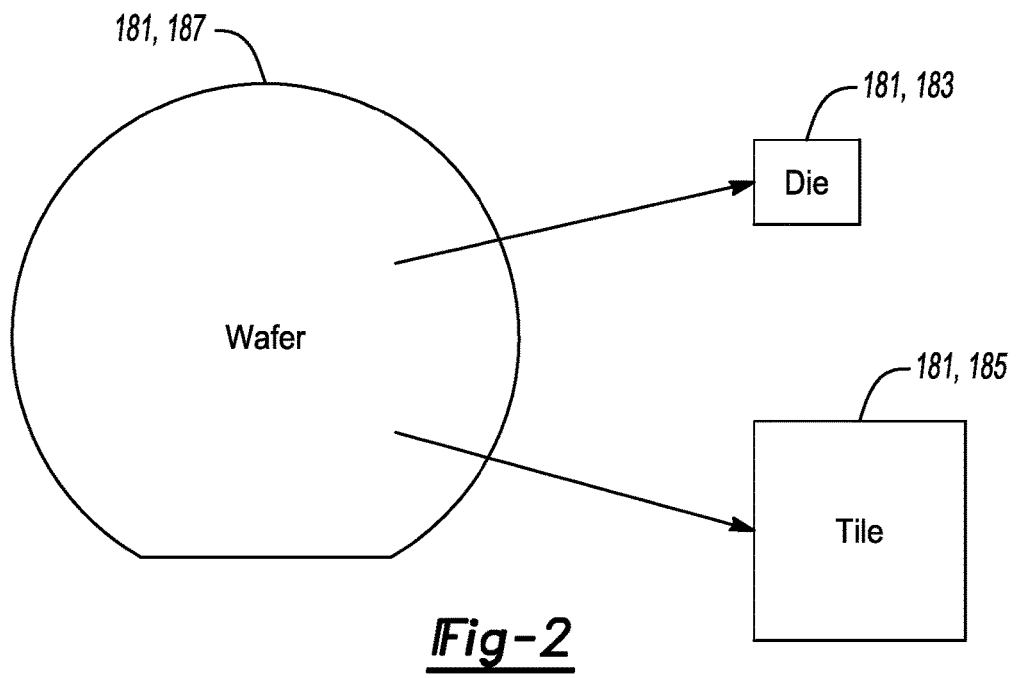
FIG. 2 is a schematic plan diagram of various substrates in accordance with one or more exemplary embodiments.

Referring to FIG. 2, a schematic plan diagram of example implementations of various substrates are shown in accordance with one or more exemplary embodiments. The substrate (e.g., the device-under-test 140 and/or the probe device 160) may be formed of a semiconductor 181. The semiconductor 181 generally includes silicon, germanium, gallium arsenide, aluminum gallium arsenide, silicon carbide, gallium nitride, indium phosphide and the like. The substrates may be in the form of a semiconductor die 183, a semiconductor tile 185, or a semiconductor wafer 187.

Referring to FIG. 3, a schematic diagram of an example arrangement of a calibration kit 400 is shown in accordance with one or more exemplary embodiments. The calibration kit 400 generally includes the device-under-test 140 and the probe device 160. The device-under-test 140 is generally positioned below the probe device 160 in the die bonder 102 (FIG. 1). The device-under-test 140 has a first surface 142 facing a second surface 162 of the probe device 160. The device-under-test 140 includes a third surface 144 opposite the first surface 142. Likewise, the probe device 160 includes a fourth surface 164 opposite the second surface 162.

Multiple test patterns 146 and multiple test pads 150 are fabricated on the first surface 142 of the device-under-test 140. The test patterns 146 may be fabricated as one or more layers of a variety of test pattern materials 148. The test pattern materials 148a-148g may include, but are not limited to, gold 148a, aluminum 148b, indium 148c, copper 148d, platinum 148e, palladium 148f, and alloys thereof 148g. The test pads 150 may be fabricated of materials similar to the test pattern materials 148.

Multiple tilt angle sensors 172 and multiple contact probes 174 are fabricated on the second surface 162 of the probe device 160. The tilt angle sensors 172 include multiple support pads 166 and multiple spikes 168. The support pads 166 are fabricated on the second surface 162 of the probe device 160. One or more spikes 168 are fabricated on the support pads 166 of the tilt angle sensors 172. The spikes 168 are fabricated as one or more layers of a spike material 170. The spike materials 170a-170u may include, but are not limited to, a single metal, single, an alloy, or a layered combination. The materials are generally selected from beryllium 170a, gold 170b, titanium 170c, palladium 170d, vanadium 170e, copper 170f, manganese 170g, nickel 170h, cobalt 170i, iron 170j, rhodium 170k, chromium 170l, molybdenum 170m, ruthenium 170n, platinum 170o, tantalum 170p, tungsten 170q, rhenium 170r, iridium 170s, aluminum oxide 170t and silicon carbide 170u.

The contact probes 174 include multiple support pads 166 and multiple probe tips 176. The support pads 166 are fabricated on the second surface 162 of the probe device 160. One or more probe tips 176 are fabricated on each support pad 166 of the contact probes 174. In various embodiments, the probe tips 176 may be created same as the spikes 168 to match a height of the spikes 168 used in the tilt angle sensors 172. Other tip designs may be implemented in the contact probes 174 to meet a design criteria of a particular application.

The first force 136a that presses the probe device 160 against the device-under-test 140 is a low force touch-down force (e.g., 15 to 50 micro-Newtons (N)/spike) use during tilt angle measurements. The second force 136b is a standard probing force (e.g., approximately 85 N/spike) used while electrically testing the device-under-test 140.

Figure 4:
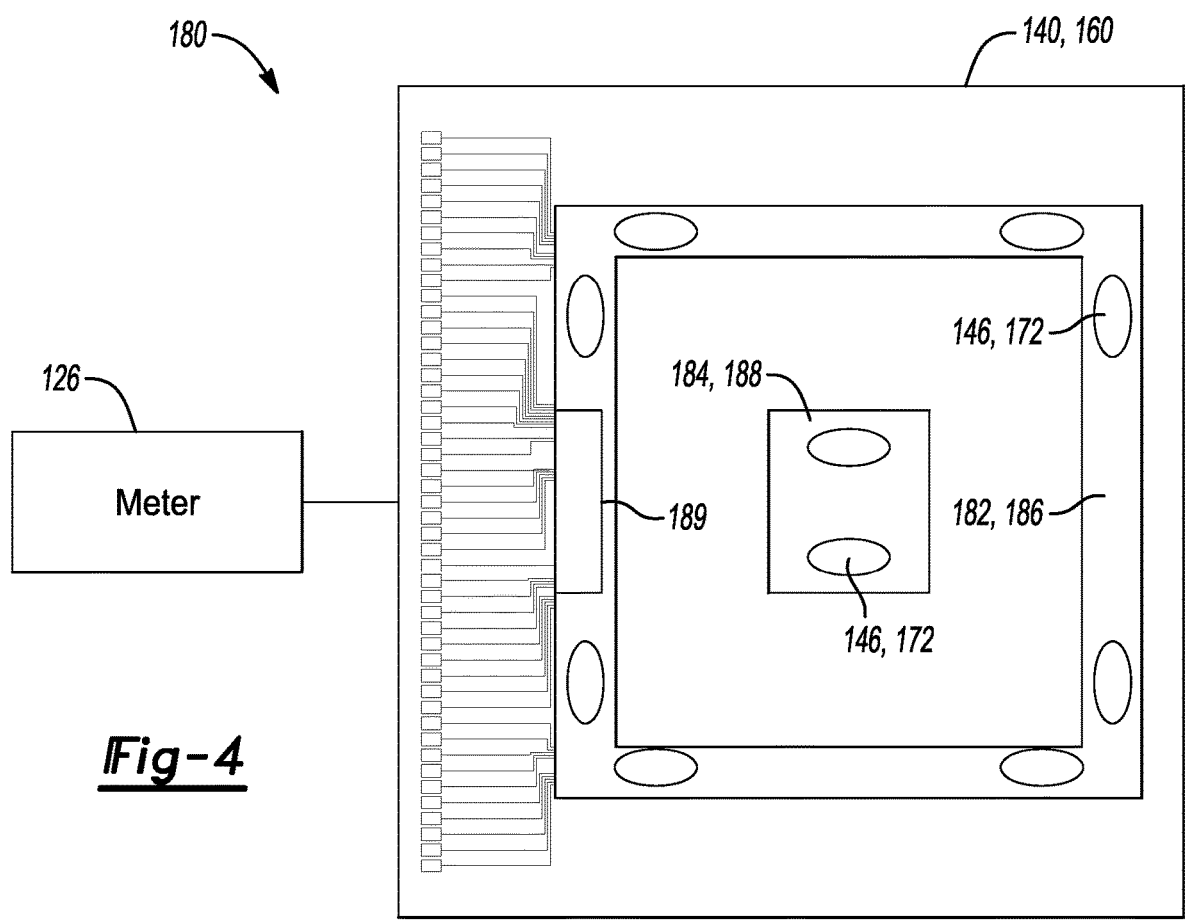
FIG. 4 is a schematic plan diagram of a device layout in accordance with one or more exemplary embodiments.

Referring to FIG. 4, a schematic plan diagram of an example device layout 180 is shown in accordance with one or more exemplary embodiments. The device layout 180 illustrates a device-under-test 140 and a probe device 160. The device layout 180 generally defines multiple areas, including a periphery 182 and a central area 186. A first group 184 of the tilt angle sensors 172 and a corresponding co-aligned group of the test patterns 146 are disposed in the periphery 182 of the device-under-test 140 and the probe device 160. In various embodiments, a second group 188 of the tilt angle sensors 172 and a corresponding co-aligned group of the test patterns 146 are disposed in the central area 186 of the device-under-test 140 and the probe device 160. A multiplexer 189 (or other suitable routing circuitry, including the redistribution layers) may be included on the probe device 160 to help connect the various tilt angle sensors 172 to the meter 126 (FIG. 1).

During an initial touch-down of the probe device 160 onto the device-under-test 140, some to every tilt angle sensors 172 make physical and electrical contact with the co-aligned test patterns 146 thereby forming closed circuits that can be sensed by the meter 126. If a subset of the tilt angle sensor 172 do not contact the co-aligned test patterns 146, the probe device 160 may be raised off the device-under-test 140, the spherical positioner 103 adjusted to improve the planarization, and the probe device 160 is lowered onto the device-under-test 140 a second time.

Referring to FIG. 5, a schematic plan diagram of an example implementation of an angle sensor layout 190 is shown in accordance with one or more exemplary embodiments. The angle sensor layout 190 illustrates the test pattern 146 and a tilt angle sensor 172. The test pattern 146 generally includes multiple pattern traces 192 on the first surface 142 of the device-under-test 140. In various embodiments, the tilt angle sensor 172 may have relatively lower alignment accuracy while still sensing the tilt angles of the probe device 160 relative to the device-under-test 140. In some embodiments, the tilt angle sensor 172 has a similar pitch as the device-under-test 140 array, although the tolerance may be relaxed. The pattern traces 192 are formed of a conductive material. The tilt angle sensor 172 includes two sets of conductive traces 194 aligned orthogonal to and crossing the pattern traces 192. Multiple spikes 168 are disposed on the conductive traces 194 and are aligned with the pattern traces 192. While a given pattern trace 192 is in physical and electrical contact with at least two spikes 168, one spike 168 in each of the two conductive traces 194, a closed circuit is formed. The closed circuit has a tilt conductance 196. In various embodiments, sensing one or more closed circuits, and thus establishing a non-zero tilt conductance 196, may be used to by the processor 122 (FIG. 1) to determine the tilt angles. In other embodiments, each pattern trace 192 may include a small resistance. A sum of the tilt conductances 196 formed through individual ones of the pattern traces 192 in contact with the conductive traces 194 through the spikes 168 establishes a total tilt conductance 198. A number of contacts through the pattern traces 192 determines a value of the total tilt conductance 198. The meter 126 (FIG. 1) may measure the value of the total tilt conductance 198 between the conductive traces 194 and the pattern traces 192 through the spikes 168. From the value of the total tilt conductance 198, the processor 122 (FIG. 1) may determine how many pattern traces 192 of each test pattern 146 are in contact with the corresponding tilt angle sensors 172.

Figure 6:
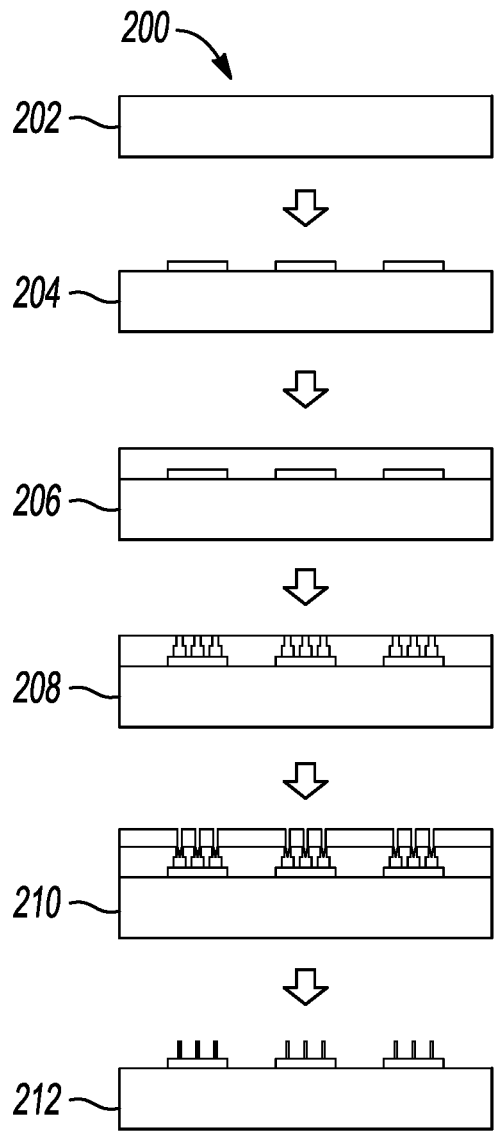
FIG. 6 is a flow diagram of a method for fabrication of spikes is shown in accordance with one or more exemplary embodiments.

Referring to FIG. 6, a schematic plan diagram of an example method 200 for fabrication of the spikes 168 is shown in accordance with one or more exemplary embodiments. The method 200 includes steps 202 to 212, as illustrated. The sequence of steps is shown as a representative example. Other step orders may be implemented to meet the criteria of a particular application. The method (or process) 200 may be performed using standard semiconductor fabrication techniques. A shape and dimensions of the spikes 168 are controlled by a lithographic patterning used to define a base diameter of the spikes 168. Deposited metal is used to fabricate the spikes 168.

In the step 202, the second surface 162 of the probe device 160 may be cleaned and prepared for a metal deposition. A metal for the pads 166 is deposited and patterned in the step 204. A mask is deposited on the pads 166 in the step 206. The mask may be a reverse image or bilayer resist process so that when images, re-entrant sidewalls result. In various embodiments, the deposition and patterning for the pads 166 may be skipped and the mask deposited directly on the probe device 160. Gaps are imaged into the mask in the step 208.

In the step 210, the spike material 170 is deposited onto the mask and into the gaps to form the spikes 168. The spike material 170 may be deposited by evaporation. The deposition results in the formation of knife-edge microstructures in the gaps. An over-coat material may optionally be formed over the spikes 168 using a photoresist coating, a photoresist patterning, and an evaporation of the over-coat material. The spike material 170 remaining on the mask and the mask itself are removed in the step 212 to leave the spikes 168 exposed and protruding away from the second surface 162 of the probe device 160.

Figure 7:
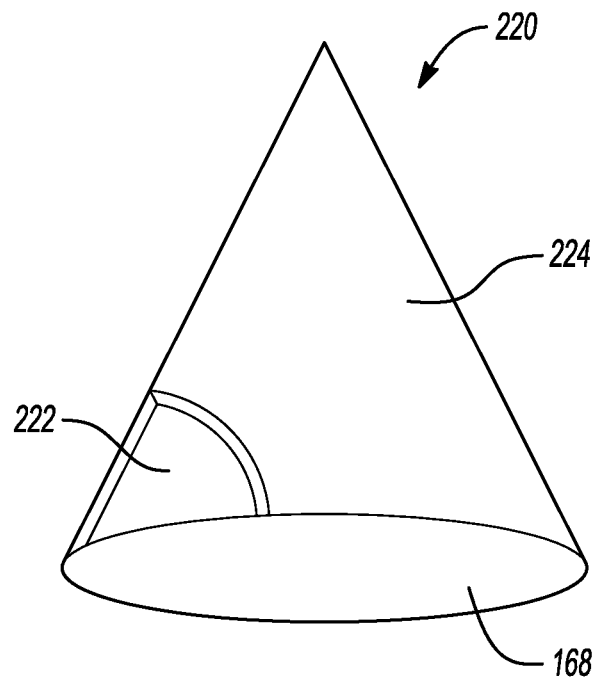
FIG. 7 is a schematic perspective diagram of a structure of a spike in accordance with one or more exemplary embodiments.

Referring to FIG. 7, a schematic perspective diagram of an example structure of a spike 168 is shown in accordance with one or more exemplary embodiments. The spike 168 generally has a cone shape 220. The spike 168 comprises an inner layer 222 optionally covered by an over-coat layer 224. The inner layer 222 may be selected from among the spike materials 170. The over-coat layer 224 may be selected from among the spike materials 170. In various embodiments, the over-coat layer 224 is included to prevent a metallurgical bond from forming between the spike 168 and the test patterns 146 due to the compressions during tilt adjustments and device testing.

A taper angle of the spikes 168 is controlled by the metal used in the fabrication. Examples of taper angles include gold (78°), titanium (68°), and platinum (78°). Other metals may be used to achieve other taper angles. The spikes 168 may be constructed with narrow tip radii of approximately 5 nanometers (nm) and larger, and a small base diameter of 0.3 micrometers (μm) and larger (e.g., ≥0.8 μm). Other tip radii and/or pitch may be implemented to meet the design criteria of a particular application.

Figure 8:
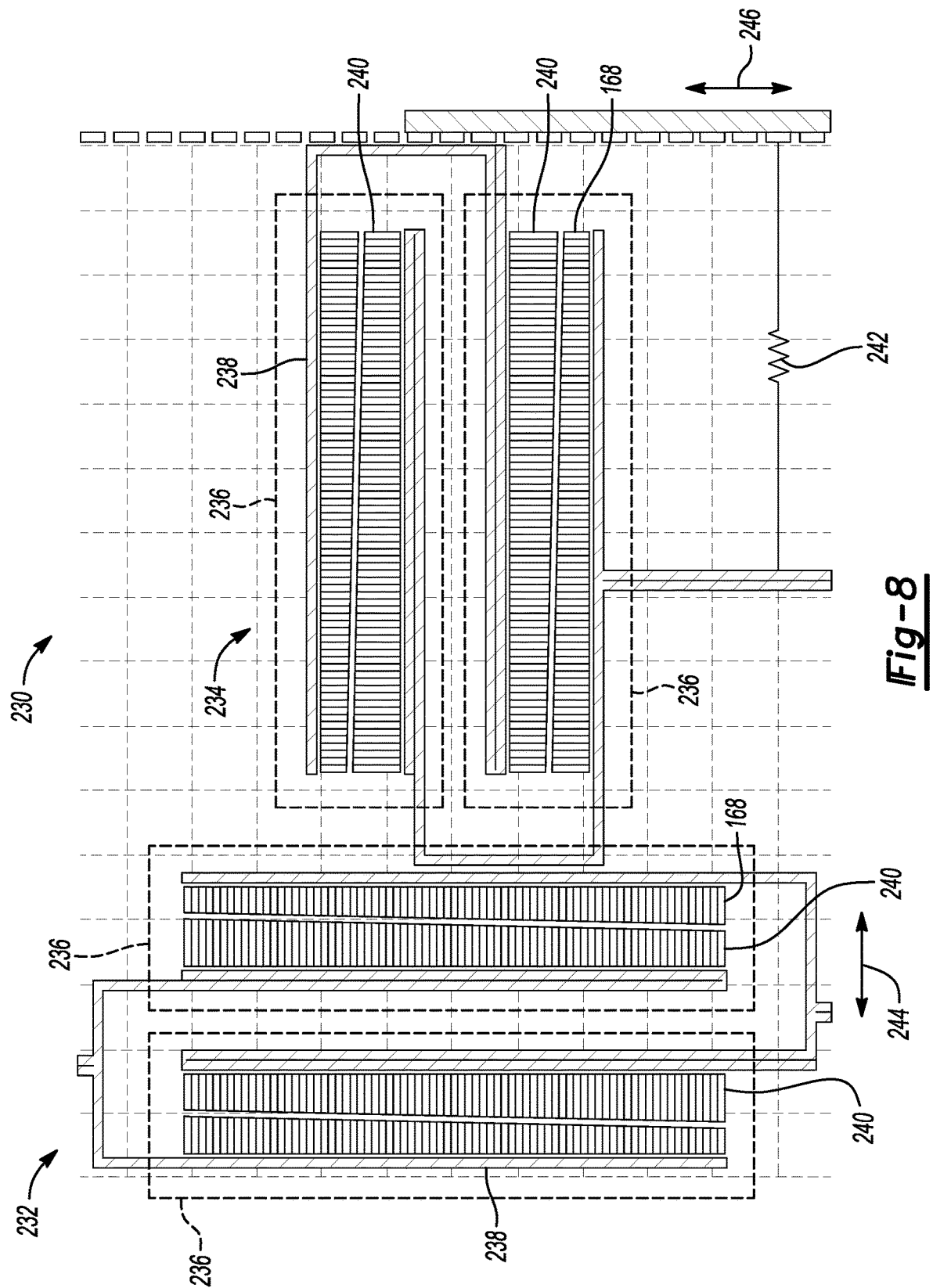
FIG. 8 is a schematic plan diagram of a position sensor layout in accordance with one or more exemplary embodiments.

Referring to FIG. 8, a schematic plan diagram of an example implementation of a position sensor layout 230 is shown in accordance with one or more exemplary embodiments. The position sensor layout 230 illustrates a first-axis position sensor 232 and second-axis position sensor 234. The first-axis (e.g., an x-axis) position sensor 232 is oriented orthogonal to the second-axis (e.g., a y-axis) position sensor 234. In various embodiments, each position sensor 232 and 234 are divided into two sub-sensors 236, with a major axis aligned parallel to each other to extend the range of by a factor of two. The position sensors 232 and 234 include two position traces 238 on the position device 160 and corresponding resistor networks 240 on the device-under-test 140. Spikes 168 are formed on the position traces 238. In various embodiments, the position sensors 232 and 234 may implement electronic Vernier sensors.

While the probe device 160 is in contact with the device-under-test 140, the spikes 168 may make physical and electrical contact the resistor networks 240. A position resistance 242 measured by the meter 126 (FIG. 1) across the position traces 238 varies based on where the spikes 168 contact the resistor networks 240. The position resistance 242 of the first-axis position sensor 232 may indicate a first horizontal alignment 244. The position resistance 242 of the second-axis position sensor 234 may indicate a second horizontal alignment 246. Optimizing the resistance value by moving the probe device 160 relative to the device-under-test 140 allows for precise alignment with an approximately 0.1 μm resolution over a range of several m (e.g., approximately 6 μm to 9 μm) in each axis.

Figure 9:
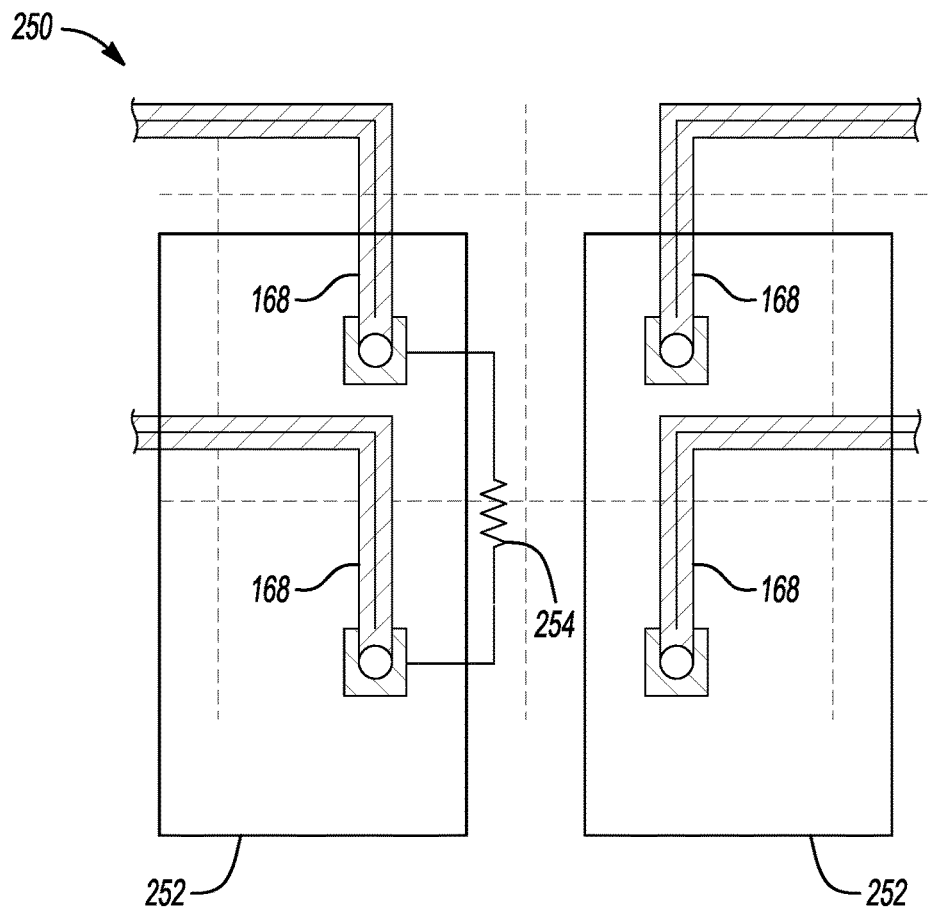
FIG. 9 is a schematic perspective diagram of a touchdown sensor in accordance with one or more exemplary embodiments.

Referring to FIG. 9, a schematic perspective diagram of an example implementation of a touchdown sensor 250 is shown in accordance with one or more exemplary embodiments. Two touchdown sensor 250 are illustrated in the figure. Each touchdown sensor 250 generally includes a pad 252 and at least two spikes 168. The at least two spikes 168 may be separated from each other by an approximately 1.5 μm to 2.0 μm pitch.

While the probe device 160 is in contact with the device-under-test 140, the meter 126 (FIG. 1) may measure a touchdown conductance 254 through the at least two spikes 168 and the corresponding pad 252. A measured conductance of zero indicates that one or both of the at least two spikes 168 are not in electrical contact with the corresponding pad 252. Therefore, the tilt and/or alignment of the probe device 160 relative to the device-under-test 140 may be changed before initially testing of the device-under-test 140. A positive (e.g., >zero) touchdown conductance 254 through the at least two spikes 168 and the corresponding pad 252 generally indicates a clean electrical contact with the pad 252. Therefore, a main spike (e.g., either spike 168) of the at least two spikes 168 may be used in testing of the device-under-test 140.

Figure 10:
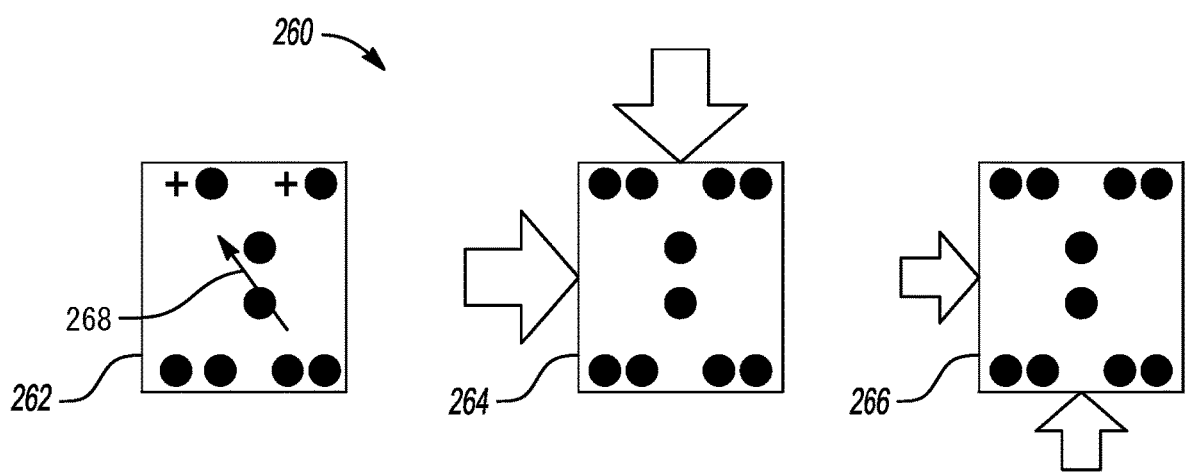
FIG. 10 is a schematic diagram of tilt angle sensor states in accordance with one or more exemplary embodiments.

Referring to FIG. 10, a schematic diagram of example tilt angle sensor states 260 is shown in accordance with one or more exemplary embodiments. The tilt angle sensor states 260 include a first state 262 after a first touchdown, a second state 264 after a second touchdown, and a third state 266 after a third touchdown. Example adjustments of the angles (phi and theta) of the spherical positioner 103 (FIG. 1) used to correct the tilt angle error, and an applied force (in Newtons (N)) per millimeter (mm) squared are provided in Table I as follows:

TABLE I

| Touchdown | Touchdown 1 | Touchdown 2 | Touchdown 3 |
|---|---|---|---|
| Force | 1.5 N/mm$^2$ | 2.2 N/mm$^2$ | 3.4 N/mm$^2$ |
| Phi (North-South) | 248 | 238 | 243 |
| Theta (East-West) | 289 | 299 | 305 |

The first state 262 illustrates an initial touchdown (e.g., a low-force touchdowns of approximately 15 uN-50 uN/spike) with an initial condition where the probe device 160 is not adequately parallel to the device-under-test 140 (FIG. 1). The low-force touchdowns generally allow electrical measurements of the tilt angle sensor contact state without bonding to the device-under-test 140. The tilt angle control aids in delineating probing (elastic) and bonding (plastic) regime interaction between the probe device 160 and device-under-test 140 as non-parallel contact orientations results in non-uniform pressure distributions. As illustrated in the first state 262, some of the tilt angle sensors 172 (circle symbols) indicate closed contacts with the corresponding test patterns 146. Other tilt angle sensors 172 (plus symbols) indicate open contacts. An arrow indicates a global tilt angle 268 between the device-under-test 140 and the probe device 160.

The global tilt angle 268 is used to determine appropriate adjustments to the die bonder 102 to improve the parallelization between the device-under-test 140 and the probe device 160. In the second state 264, the circle symbols indicate that each tilt angle sensor 172 has contacted a corresponding test pattern 146, and so no global tilt angle 268 is illustrated.

The final touchdown in the third state 266 was performed at probing force levels. The third state 266 showed fully contacted tilt angle sensors 172 and 100% contact yields for multiple (e.g., five) daisy-chain test arrays (e.g., 10,000 element chains per array) fabricated on the device-under-test 140.

A parallelism of the die bonder 102 is generally specification at approximately ±60 microradians. Such level of tilt error corresponds to a ±0.24 µm height variation over a 4 mm distance (typical of the chip sets) and/or to a ±1.2 µm height variation over a 20 mm distance (typical of the reticle sizes). However, backside surface imperfections (e.g., particles and dicing micro-cracks) may cause pressure-dependent height variation during the probing and result in the tilt angle errors. To improve the parallelism between the spikes 168 on the probe device 160 and the device-under-test 140 during probing, feedback control (e.g., manually or automated) by using the on-chip tilt angle sensor measurements to correct tilt errors during the low-force touchdowns.

The spherical positioner 103 (FIG. 1) is used to adjust the phi (North-South) and the theta (East-West) spherical angles of the upper arm relative to the chuck based on tilt conditions derived by monitoring the unit contactor states. The low-force touchdowns are used to sense the tilt angle sensor states and adjustments are subsequently applied to the spherical positioner 103 for subsequent touchdowns, until the errors are eliminated or brought to within acceptably small limits. After the tilt errors are nulled (sensed by 100% reported closed states), an appropriate level of force is applied for probing the device-under-test 140.

Figure 11:
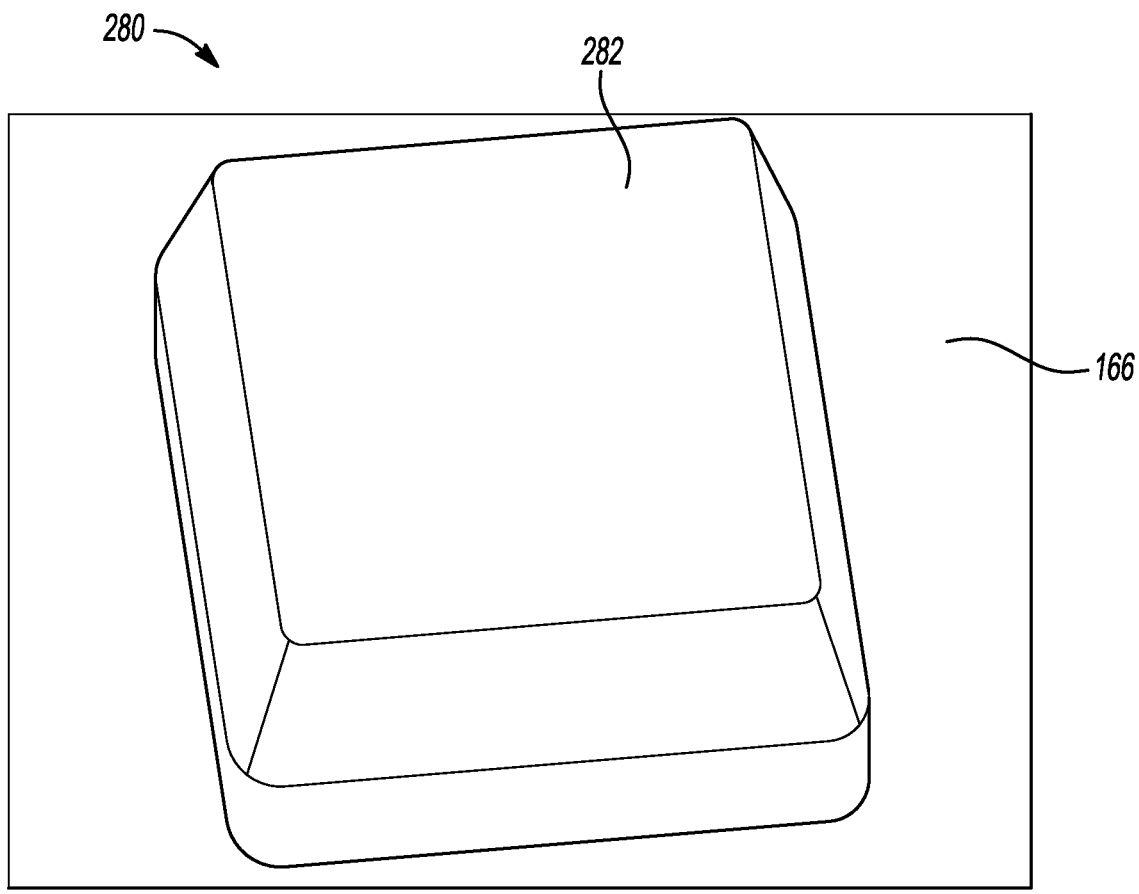
FIG. 11 is an image of a resilient pillar in accordance with one or more exemplary embodiments.

Referring to FIG. 11, an image 280 of an example resilient pillar 282 is shown in accordance with one or more exemplary embodiments. The image 280 illustrates a scanning electron micrograph of a resilient pillar 282 disposed between a spike 168 (not shown) and the support pads 166. One resilient pillar 282 may be formed for each spike 168 of the probe device 160. Each resilient pillar 282 may be fabricated using elastomer layers, such as polyimide (Young's modulus 3 GPa), to act as spring-like cushion layer. In various embodiments, the elastomer layers may be the polyimide, Polydimethylsiloxane (PDMS), Polymethyl methacrylate (PMMA), Polyethylene, Polytetrafluoroethylene (PTFE), and/or Polyvinyl chloride (PVC). Each resilient pillar 282 may be approximately 2 µm tall.

To ensure the operation in the elastic regime, finite-element analysis modeling was used to provide guidance on the choice of thickness and modulus of the polymer layers. The conclusions of experimental tests utilizing the tilt angles sensors 172 to measure the elastomer performance were that under typical applied forces (<85 µN/probe) for spike probing, approximately less than 40 microradian angle corrections were available. Greater angle corrections were unfavorable due to the relatively high modulus and reasonably small thickness (2 µm) of the polyimide materials (a limitation of the available materials). The modeling showed that approximately 100 microradians passive tilt correction may be possible with greater polyimide thicknesses or the use of lower modulus polymer layers (e.g., PDMS: Young's Modulus 300 megapascals (MPa)). Employing the resilient pillars 282 means that fewer tilt angle sensors 172 may be placed around the periphery of the probe device 160 as high-yield probe contacts may be achieved without determining exact tilt angles to correct the tilt errors.

While probing was performed with test arrays with relatively uniform, thin contacts (e.g., 160 nm) directly on silicon substrates, foundry-derived chipsets may have larger pad-to-pad height variations. To address the local topography nonuniformities, the spikes 168 may be formed on elastomer pillars to allow independent suspension of the individual spike-to-test pattern probe contacts.

Figure 12:
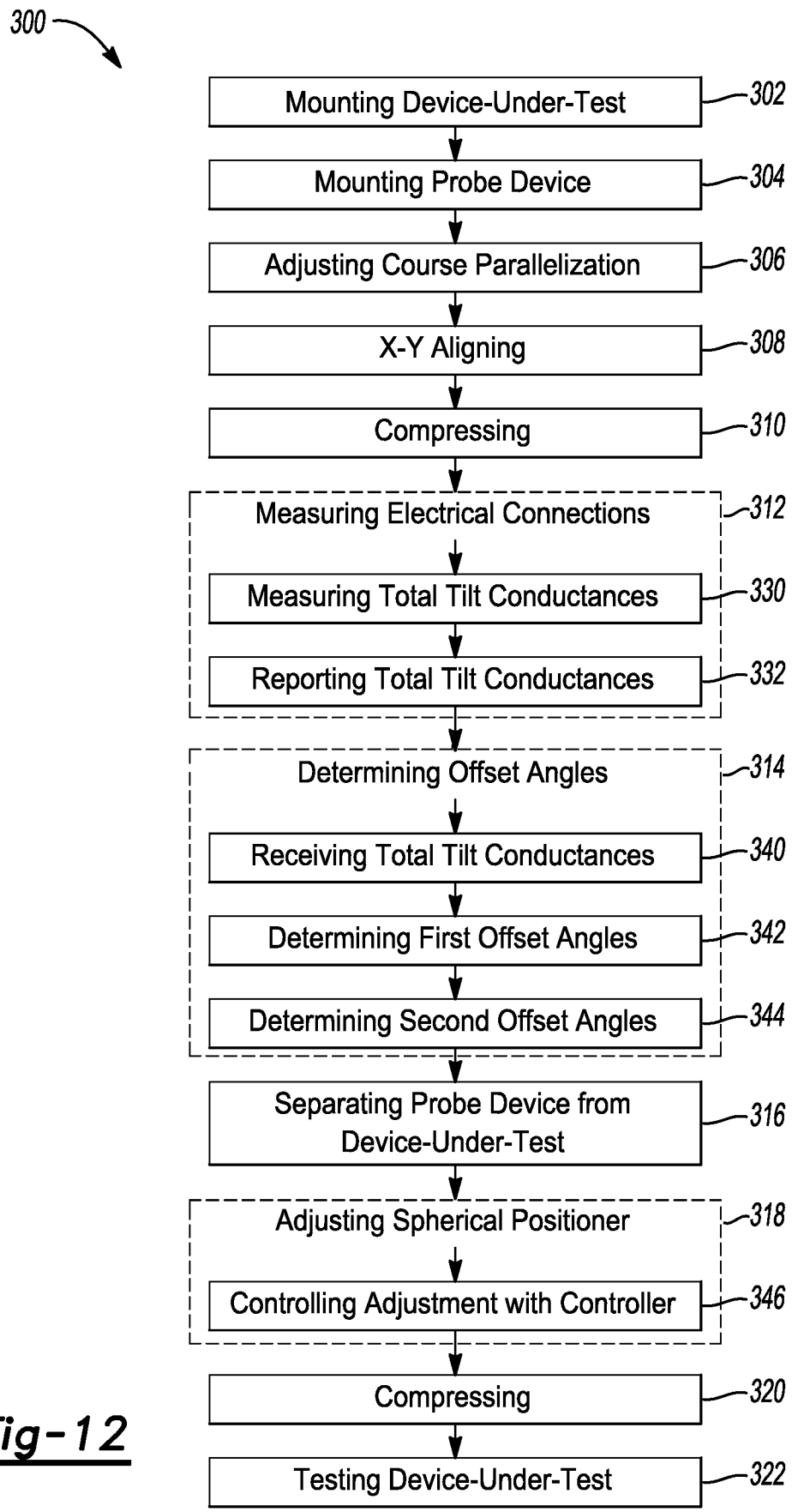
FIG. 12 is a flow diagram of a method to aid in a calibration of the probing system in accordance with one or more exemplary embodiments.

Referring to FIG. 12, a flow diagram of an example method 300 to aid in a calibration of the probing system 100 is shown in accordance with one or more exemplary embodiments. The method 300 includes steps 302 to 346, as illustrated. The sequence of steps is shown as a representative example. Other step orders may be implemented to meet the criteria of a particular application. The method (or process) 300 is implemented with the probing system 100 with the device-under-test 140 and the probe device 160.

In the step 302, the device-under-test 140 is mounted to the bottom chuck 106 with the first surface 142 of the device-under-test 140 facing outward. The probe device 160 is mounted to the top chuck 104 with the second surface 162 facing the first surface 142 of the device-under-test 140 in the step 304. The spherical positioner may be adjusted to a course parallelization in the step 306. In the step 308, the probe device 160 is aligned to the device-under-test 140 in the x-axis and the y axis.

In the step 310, the probe device 160 and the device-under-test 140 are pressed together with the first force 136*a* to cause at least a subset of the spikes 168 of the tilt angle sensors 172 to contact the test patterns 146. A number of electrical connections formed between the tilt angle sensors 172 and the test patterns 146 is measured in the step 312. Determining the number of electrical connections generally includes measuring total tilt conductances 198 through the tilt angle sensors 172 and the test patterns 146 in the step 330. Each tilt angle sensor 172 includes two sets of spikes 168. Each test pattern 146 includes pattern traces 192. Each contacted pattern trace 192 contributes a respective tilt conductance 196 to a corresponding total tilt conductance 198. The total tilt conductances 198 are reported in the step 332 from the meter 126 to the processor 122.

In the step 314, the processor 122 determines a first offset angle 130*c* and a second offset angle 130*d* between the first surface 142 of the device-under-test 140 and the second surface 162 of the probe device 160 based on the total tilt conductances 198 (e.g., the number of electrical connections). Determining the first offset angle 130*d* generally includes receiving the total tilt conductances 198 at the processor 122 in the step 340. In the step 342, the processor 122 determines the first offset angle 130c with a first group 184 of the tilt angle sensors 172 that are oriented in the first direction 134c. In the step 344, the processor 122 determines the second offset angle 130d with the second group 188 of the tilt angle sensors 172 that are oriented in the second direction 134b.

The probe device 160 is separated from the device-under-test 140 in the step 316. The spherical positioner 103 is adjusted in the step 318 in one or more rotational axes in response to the first offset angle 130c and the second offset angle 130d to change a parallelism between the first surface 142 of the device-under-test 140 and the second surface 162 of the probe device 160. Adjusting the rotational axes may include controlling the adjustment of the spherical positioner with the processor 122 in the step 346 in response to the first offset angle 130c and the second offset angle 130d.

After the spherical positioner 103 is adjusted, the probe device 160 and the device-under-test 140 are compressed together in the step 320 with the second force 136b. If the subsequent parallelization is acceptable, the device-under-test 140 may be electrically tested in the step 322 by the computer 120.

Figure 13:
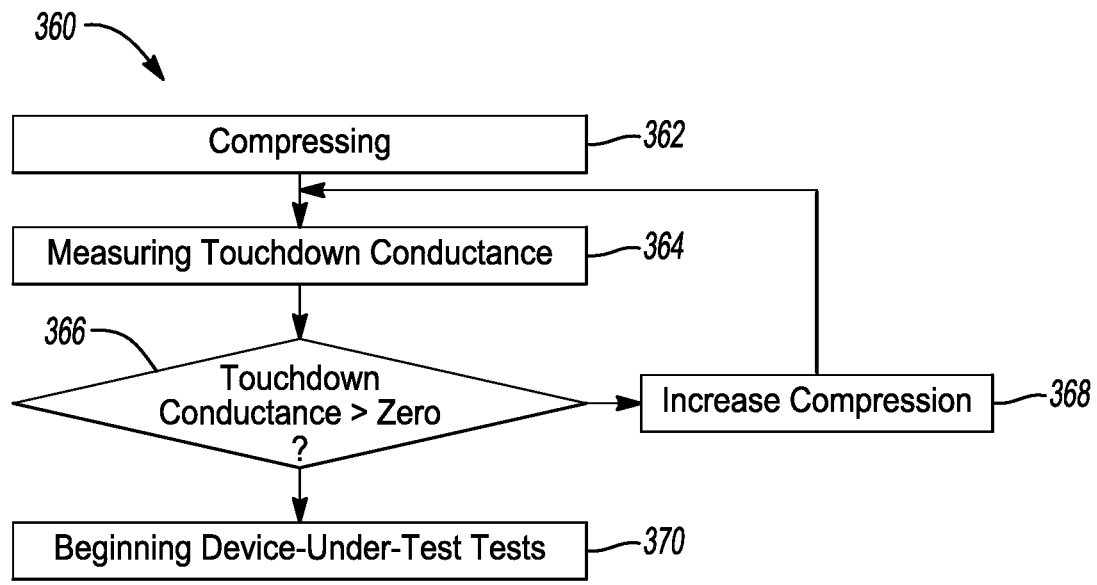
FIG. 13 is a flow diagram of a method to determine a touchdown status in accordance with one or more exemplary embodiments.

Referring to FIG. 13, a flow diagram of an example method 360 to determine a touchdown status is shown in accordance with one or more exemplary embodiments. The method generally includes steps 362 to 370, as illustrated. The sequence of steps is shown as a representative example. Other step orders may be implemented to meet the criteria of a particular application.

In the step 362, the probe device 160 and the device-under-test 140 are compressed together with a force (e.g., the first force 136a). A touchdown conductance through each of at least two probe tips 176 tips and a respective test pad 150 is measured in the step 364. A check is performed in the step 366 to determine if the touchdown conductance greater than zero. If not, the compression is increased in the step 368 and the touchdown conductance is measured again. Once the touchdown conductance is greater than zero testing of the device-under-test 140 may begin in the step 370.

Figure 14:
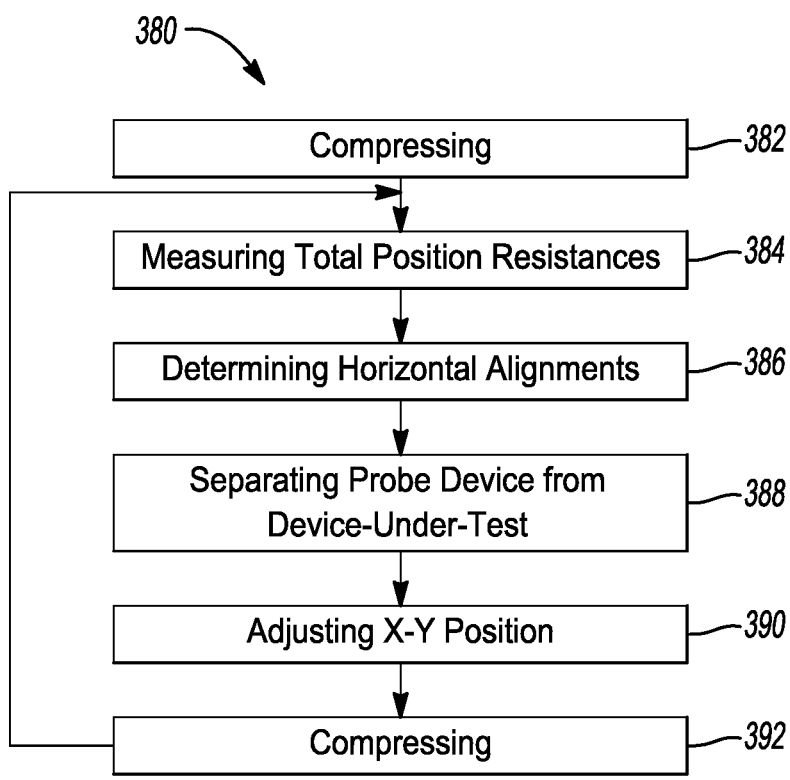
FIG. 14 is a flow diagram of an example method for X-Y alignment in accordance with one or more exemplary embodiments.

Referring to FIG. 14, a flow diagram of an example method 380 for X-Y alignment is shown in accordance with one or more exemplary embodiments. The method generally includes steps 382 to 392, as illustrated. The sequence of steps is shown as a representative example. Other step orders may be implemented to meet the criteria of a particular application.

In the step 382, the probe device 160 and the device-under-test 140 are compressed together with a force (e.g., the first force 136a). The position resistances 242 are measured in the step 384 through the position sensors 232 and 234 and the corresponding resistor networks 240. The first horizontal alignment 244 and a second horizontal alignment 246 between the device-under-test 140 and the probe device 160 is determined in the step 386 based on the position resistances 242.

In the step 388, the probe device 160 is separated from the device-under-test 140. The relative X-Y position of the probe device 160 is adjusted in the step 390 based on the first horizontal alignment and the second horizontal alignment. In the step 392, the probe device 160 and the device-under-test 140 are compressed together with another force (e.g., the second force 136b). The steps of measuring, determining, and adjusting may be repeated until the probe device 160 is sufficiently aligned to the device-under-test 140 for further processing.

The fabrication of the spikes 168 is useful in the tilt angle measurements, X-Y alignment, and touchdown measurements, and generally outperforms standard methods. The fabrication process provides advantages of fine-pitch arrays (e.g., less than 10 μm). The fabrication process enables arrays with low tip height variation (e.g., down to <10 nm) because the spike heights are made with a self-limiting process that enables high fidelity replication. The sharp tips (e.g., approximately 10 nm dimensions) are integral to the fabrication process as the photoresist opening is closed as the titanium is deposited. The fabrication process provides an ability to fabricate a variety of different metals with high hardness (e.g., >116 gigapascals (GPa)). The fabrication process also provides an ability to engineer the hardness by layering the spike structure (e.g., titanium and tungsten layered with softer metals such as gold, platinum, and palladium) and/or apply an over-coat to the spikes to improve its release after indentation and prevent metallurgical bonds to form (e.g., natural oxides help to prevent metallurgical bonds to indented material layers or bumps).

The probing system 100 provides a method and a probe device that includes fine-pitch arrays of high hardness, conically shaped needle-like microstructures (spikes) that provides fine tilt and position measuring capabilities. The probing system 100 includes tilt angle sensors for fine-pitch ($\leq 10$ μm pitch) array probing. Various embodiments provide a measurement of local contact states and global tilt angles during touchdown operations between a probe array of spikes and a device-under-test. Fine-pitch probing with densities $>10^4$ contacts/mm$^2$ involves a high degree of parallelism between the probe head and device-under-test surfaces to ensure high yield contact. However, the fine-pitch dimensions constrain the employable probe-delivery mechanisms (cantilevers, springs, etc.) to generate enough displacement across the probe head area (e.g., chip or reticle size) to overcome inherent platform misalignments (e.g., parallelism tolerances) and process related factors (e.g., backside irregularities including particles and micro-cracks, and clamping distortions) that contribute to tilting errors in the probing process. Given such constraints, the probing system 100 provides a compact set of integrated sensors for fine-pitch area array probers that provides local contact sensing and global tilt angle measurements during low-force touchdowns, and feedback signals used by the prober platform (precision hardware) to correct non-parallel orientations.

The tilt angle sensors include a set of distributed touchdown sensing units across the probe head, each with a set of redundant sensors (e.g., bridging contactor links with spikes on the probe head side that are shorted by contact lines on the device-under-test). The sensing units are positioned, often uniformly, around a perimeter as well as in the center of the probe array. The arrangement and numbers of the sensing units determine the accuracy of the tilt angle measurement. The sensing units provide information on the physical contact state of a particular location at touchdown of the probe array on the device-under-test and, taken collectively, provide a measurement of the global tilt angle. The tilt angles are corrected by the prober platform using the information provided by the tilt angles sensors. The prober platform thus serves multiple functions, including precision tilt angle control as well as a station for holding the probe device and the device-under-test (die or wafer), providing controlled force levels during probe touchdowns, and precise positioning and alignment of the probe and device-under-test fine-pitch layouts.

Various embodiments provides improved tilt angle sensors that support fine-pitch area array probing. The tilt angle sensors perform local contact measurements to determine global tilt conditions. Elimination of the tilt angles helps achieve reliable probe array touchdowns between probe arrays of spikes and devices-under-test. Advantages of the techniques disclosed herein may include, but are not limited to, sensing and elimination of tilt angle errors in fine-pitch area array probing, small form-factor angle sensors that utilize spike-based probes capable of fine-pitch (≤2 μm) contact probes and compact footprints, applications to a range of fine-pitch devices-under-test without modification, low force sensor operation that avoids contact pad damage during pre-alignment and probing procedures, allowing multiple touchdowns to optimize correction of tilt errors, an ability to sense and correct tilt angle errors under applied force, real-time local contact and global tilt angle measurements under probe touchdown operations, and instant pre-examination of engaging local pressure and uniformity to ensure bonding quality during multi-chip bonding.

This disclosure is susceptible of embodiments in many different forms. Representative embodiments of the disclosure are shown in the drawings and will herein be described in detail with the understanding that these embodiments are provided as an exemplification of the disclosed principles, not limitations of the broad aspects of the disclosure. To that extent, elements and limitations that are described, for example, in the Abstract, Background, Summary, and Detailed Description sections, but not explicitly set forth in the claims, should not be incorporated into the claims, singly or collectively, by implication, inference or otherwise.

For purposes of the present detailed description, unless specifically disclaimed, the singular includes the plural and vice versa. The words "and" and "or" shall be both conjunctive and disjunctive. The words "any" and "all" shall both mean "any and all", and the words "including," "containing," "comprising," "having," and the like shall each mean "including without limitation." Moreover, words of approximation such as "about," "almost," "substantially," "approximately," and "generally," may be used herein in the sense of "at, near, or nearly at," or "within 0-5% of," or "within acceptable manufacturing tolerances," or other logical combinations thereof. Referring to the drawings, wherein like reference numbers refer to like components.

The detailed description and the drawings or FIGS. are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment may be combined with one or a plurality of other desired characteristics from other embodiments, resulting in other embodiments not described in words or by reference to the drawings. Accordingly, such other embodiments fall within the framework of the scope of the appended claims.

What is claimed is:

1. A probing system comprising:
   a device-under-test that includes a plurality of test patterns on a first surface;
   a probe device that includes a plurality of tilt angle sensors, wherein the plurality of tilt angle sensors include a plurality of spikes that protrude from a second surface of the probe device; and
   a die bonder having a spherical positioner that is adjustable in a plurality of rotational axes, wherein the die bonder is operational to:
      mount the device-under-test with the first surface facing outward;
      mount the probe device with the second surface of the probe device facing the first surface of the device-under-test;
      compress the probe device and the device-under-test together with a first force that causes a subset of the plurality of spikes to contact the plurality of test patterns;
      measure a number of electrical connections formed between the plurality of tilt angle sensors and the plurality of test patterns;
      determine a first offset angle and a second offset angle between the first surface of the device-under-test and the second surface of the probe device based on the number of electrical connections;
      separate the probe device from the device-under-test; and
      adjust the spherical positioner in one or more of the plurality of rotational axes in response to the first offset angle and the second offset angle to change a parallelism between the first surface of the device-under-test and the second surface of the probe device.

2. The probing system according to claim 1, wherein:
   the die bonder is further operational to compress the probe device and the device-under-test together with a second force after the spherical positioner is adjusted; and
   the second force is greater than the first force.

3. The probing system according to claim 1, further comprising:
   a meter operational to measure a plurality of total tilt conductances through the plurality of tilt angle sensors and the plurality of test patterns, wherein:
      each of the plurality of tilt angle sensors includes two sets of the plurality of spikes;
      each of the plurality of test patterns includes a plurality of pattern traces; and
      each of the plurality of pattern traces contributes a respective tilt conductance between the two sets while electrically connected to at least one spike of the plurality of spikes in each of the two sets.

4. The probing system according to claim 3, wherein the die bonder includes a processor operational to:
   receive the plurality of total tilt conductances from the meter;
   calculate the first offset angle and the second offset angle based on the plurality of total tilt conductances; and
   control the adjustment of the spherical positioner in response to the first offset angle and the second offset angle.

5. The probing system according to claim 1, wherein:
   the first offset angle is determined with a first group of the plurality of tilt angle sensors that are oriented in a first direction;
   the second offset angle is determined with a second group of the plurality of tilt angle sensors that are oriented in a second direction; and
   the first direction is orthogonal to the second direction.

6. The probing system according to claim 1, further comprising:
   a plurality of test pads disposed on the first surface of the device-under-test;

a plurality of probe tips that protrude from the second surface of the probe device, wherein at least two probe tips of the plurality of probe tips contact each respective test pad of the plurality of test pads; and a meter operational to measure a touchdown conductance through each of the at least two probe tips and the respective test pad.

7. The probing system according to claim 1, further comprising a plurality of resilient pillars disposed between the plurality of spikes and the second surface of the probe device to account for height variations among the plurality of test patterns.

8. The probing system according to claim 1, further comprising:

a plurality of resistor networks disposed on the first surface of the device-under-test;

a plurality of position sensors that protrude from the second surface of the probe device; and a meter operational to measure a plurality of position resistances through the plurality of position sensors and the plurality of resistor networks, wherein:

the plurality of position resistances determines a first horizontal alignment and a second horizontal alignment between the device-under-test and the probe device; and the first horizontal alignment and the second horizontal alignment are in orthogonal directions.

9. The probing system according to claim 1, wherein:

a first group of the plurality of test patterns are disposed around a periphery of the device-under-test; and a second group of the plurality of test patterns are disposed in a central area of the device-under-test.

10. A method to aid in a tilt calibration for probing comprising:

mounting a device-under-test in a die bonder with a first surface of the device-under-test facing outward, wherein:

the device-under-test has a plurality of test patterns on the first surface; and the die bonder has a spherical positioner that is adjustable in a plurality of rotational axes;

mounting a probe device in the die bonder with a second surface of the probe device facing the first surface of the device-under-test, wherein:

the probe device has a plurality of tilt angle sensors; and the plurality of tilt angle sensors have a plurality of spikes that protrude from the second surface; and compressing the probe device and the device-under-test together with a first force that causes a subset of the plurality of spikes to contact the plurality of test patterns;

measuring a number of electrical connections formed between the plurality of tilt angle sensors and the plurality of test patterns;

determining a first offset angle and a second offset angle between the first surface of the device-under-test and the second surface of the probe device based on the number of electrical connections;

separating the probe device from the device-under-test; and adjusting the spherical positioner in one or more of the plurality of rotational axes in response to the first offset angle and the second offset angle to change a parallelism between the first surface of the device-under-test and the second surface of the probe device.

11. The method according to claim 10, further comprising:

compressing the probe device and the device-under-test together with a second force after the spherical positioner is adjusted, wherein the second force is greater than the first force.

12. The method according to claim 10, wherein the measuring of the number of electrical connections comprises:

measuring a plurality of total tilt conductances through the plurality of tilt angle sensors and the plurality of test patterns, wherein:

each of the plurality of tilt angle sensors includes two sets of the plurality of spikes;

each of the plurality of test patterns includes a plurality of pattern traces; and each of the plurality of pattern traces contributes a respective tilt conductance between the two sets while electrically connected to at least one spike of the plurality of spikes in each of the two sets.

13. The method according to claim 12, further comprising:

receiving at a processor the plurality of total tilt conductances;

calculating the first offset angle and the second offset angle based on the plurality of total tilt conductances; and controlling the adjustment of the spherical positioner with the processor in response to the first offset angle and the second offset angle.

14. The method according to claim 10, wherein the determining of the first offset angle and the second offset angle comprises:

determining the first offset angle with a first group of the plurality of tilt angle sensors that are oriented in a first direction; and determining the second offset angle with a second group of the plurality of tilt angle sensors that are oriented in a second direction, wherein the first direction is orthogonal to the second direction.

15. The method according to claim 10, further comprising:

measuring a touchdown conductance through each of at least two probe tips of a plurality of probe tips and a respective test pad of a plurality of test pads, wherein:

the plurality of test pads are disposed on the first surface of the device-under-test;

the plurality of probe tips extend from the second surface of the probe device; and at least two probe tips of the plurality of probe tips contact each respective test pad of the plurality of test pads.

16. The method according to claim 10, further comprising:

measuring a plurality of position resistances through a plurality of position sensors and a plurality of resistor networks; and determining a first horizontal alignment and a second horizontal alignment between the device-under-test and the probe device based on the plurality of position resistances, wherein:

the plurality of resistor networks are disposed on the device-under-test;

the plurality of position sensors are disposed on the probe device; and the first horizontal alignment and the second horizontal alignment are in orthogonal directions.

17. A calibration kit comprising:
a probe device that includes a plurality of tilt angle sensors, wherein:
   the plurality of tilt angle sensors have a plurality of spikes that protrude from a second surface of the probe device; and
   each of the plurality of tilt angle sensors includes two sets of the plurality of spikes;
a device-under-test that includes a plurality of test patterns disposable on a first surface, wherein:
   each of the plurality of test patterns includes a plurality of pattern traces; and
   each of the plurality of pattern traces contributes a respective tilt conductance between the two sets while electrically connected to at least one spike of the plurality of spikes in each of the two sets;
a meter operational to measure a number of electrical connections formed between the plurality of tilt angle sensors and the plurality of test patterns while compressed together; and
a processor operational to determine a first offset angle and a second offset angle between the first surface of the device-under-test and the second surface of the probe device based on the number of electrical connections.

18. The calibration kit according to claim 17, wherein the first offset angle and the second offset angle are correctable to less than 60 microradians.

19. The calibration kit according to claim 17, wherein a pitch of the plurality of spikes is less than 2 micrometers.

20. The calibration kit according to claim 17, wherein:
the plurality of pattern traces is formed from gold, aluminum, indium, copper, platinum, palladium, or an alloy thereof; and
the plurality of spikes is formed from one of (i) a single metal, (ii) an alloy and (iii) a layered combination selected from beryllium, gold, titanium, palladium, vanadium, copper, manganese, nickel, cobalt, iron, rhodium, chromium, molybdenum, ruthenium, platinum, tantalum, tungsten, rhenium, iridium, aluminum oxide, and silicon carbide.

* * * * *